United States Patent [19]
Hu et al.

[11] Patent Number: 6,074,905
[45] Date of Patent: Jun. 13, 2000

[54] FORMATION OF A THIN OXIDE PROTECTION LAYER AT POLY SIDEWALL AND AREA SURFACE

[75] Inventors: Chu-Wei Hu, Taichung; Chung-Te Lin, Tainan; Chin-Shan Hou, Hsin-Chu; Kuo-Hua Pan, Taichung, all of Taiwan

[73] Assignee: Taiwan Semiconductor Manufacturing Company, Hsin-Chu, Taiwan

[21] Appl. No.: 09/222,285

[22] Filed: Dec. 28, 1998

[51] Int. Cl.$^7$ .............................................. H01L 21/8238
[52] U.S. Cl. ............................................. 438/224; 438/636
[58] Field of Search ..................... 438/223, 224, 438/227, 228, 296, 297, 636

[56] References Cited

U.S. PATENT DOCUMENTS

| | | | |
|---|---|---|---|
| 5,437,765 | 8/1995 | Loewenstein | 216/51 |
| 5,605,601 | 2/1997 | Kawasaki | 156/643 |
| 5,700,737 | 12/1997 | Yu et al. | 438/636 |
| 5,707,883 | 1/1998 | Tabara | 438/636 |
| 5,741,396 | 4/1998 | Loewenstein | 156/643 |
| 5,759,885 | 6/1998 | Son | 438/224 |
| 5,767,018 | 6/1998 | Bell | 438/696 |

*Primary Examiner*—Chandra Chaudhari
*Attorney, Agent, or Firm*—George O. Saile; Stephen B. Ackerman; Rosemary L. S. Pike

[57] ABSTRACT

A new method for forming polysilicon lines using a SiON anti-reflective coating during photolithography wherein a thin oxide protection layer is formed over the polysilicon sidewalls and active area surfaces after etching to prevent damage caused by removal of the SiON in the fabrication of integrated circuits is achieved. A gate oxide layer is provided on the surface of a silicon substrate. A polysilicon layer is deposited overlying the gate oxide layer. A SiON anti-reflective coating layer is deposited overlying the polysilicon layer. A photoresist mask is formed over the SiON anti-reflective coating layer. The SiON anti-reflective coating layer, polysilicon layer, and gate oxide layer are etched away where they are not covered by the photoresist mask to form polysilicon lines. The polysilicon lines and the silicon substrate are oxidized to form a protective oxide layer on the sidewalls of the polysilicon lines and on the surface of the silicon substrate. The SiON anti-reflective coating layer is removed wherein the protective oxide layer protects the polysilicon lines and the silicon substrate from damage to complete fabrication of polysilicon lines in the manufacture of an integrated circuit device.

22 Claims, 2 Drawing Sheets

FORMATION OF A THIN OXIDE PROTECTION LAYER AT POLY SIDEWALL AND AREA SURFACE

BACKGROUND OF THE INVENTION

1. Field of the Invention

The present invention relates to the fabrication of integrated circuit devices, and more particularly, to a method of forming polysilicon lines in which a thin oxide protection layer prevents damage to poly sidewalls and active area surfaces in the fabrication of integrated circuits.

2. Description of the Prior Art

In the fabrication of integrated circuits, photolithography and etching are used to form structures such as polysilicon gates, word lines, bit lines, local oxidation of silicon (LOCOS), shallow trench isolation (STI), and the like. A photoresist material is coated over the layer or layers to be etched. The photoresist material is exposed to actinic light through a mask, then developed to form the photoresist mask for etching the underlying layer or layers. An anti-reflective coating (ARC) layer, typically silicon oxynitride (SiON) is used under the photoresist layer to improve the photolithography process window for the polysilicon layer. However, removal of the SiON after etching, usually using hot $H_3PO_4$ wet etching, induces sidewall damage to the polysilicon lines and top roughness of the active area.

U.S. Pat. No. 5,767,018 to Bell discusses a pitting of the active area surface that is believed to result from the interaction of the main polysilicon etch with the SiON ARC layer. Their solution is to use an etching recipe in which a polymer is formed on the sidewalls of the polysilicon lines during etching to prevent the pitting. U.S. Pat. No. 5,605,601 to Kawasaki discloses a method of etching multi-layered polysilicon gates. U.S. Pat. Nos. 5,437,765 and 5,741,396 to Loewenstein teach a method in which a SiON top layer is etched selectively with respect to silicon oxide and polysilicon.

SUMMARY OF THE INVENTION

Accordingly, it is a primary object of the invention to provide an effective and very manufacturable process for forming polysilicon lines without polysilicon sidewall and active area surface damage in the fabrication of integrated circuits.

It is a further object of the invention to form polysilicon lines using a SiON anti-reflective coating during photolithography without polysilicon sidewall and active area surface damage in the fabrication of integrated circuits.

A still further object of the invention is to form polysilicon lines using a SiON anti-reflective coating during photolithography wherein a thin oxide protection layer is formed over the polysilicon sidewalls and active area surfaces after etching to prevent damage caused by removal of the SiON in the fabrication of integrated circuits.

In accordance with the objects of the invention, a new method for forming polysilicon lines using a SiON anti-reflective coating during photolithography wherein a thin oxide protection layer is formed over the polysilicon sidewalls and active area surfaces after etching to prevent damage caused by removal of the SiON in the fabrication of integrated circuits is achieved. A gate oxide layer is provided on the surface of a silicon substrate. A polysilicon layer is deposited overlying the gate oxide layer. A SiON anti-reflective coating layer is deposited overlying the polysilicon layer. A photoresist mask is formed over the SiON anti-reflective coating layer. The SiON anti-reflective coating layer, polysilicon layer, and gate oxide layer are etched away where they are not covered by the photoresist mask to form polysilicon lines. The polysilicon lines and the silicon substrate are oxidized to form a protective oxide layer on the sidewalls of the polysilicon lines and on the surface of the silicon substrate. The SiON anti-reflective coating layer is removed wherein the protective oxide layer protects the polysilicon lines and the silicon substrate from damage to complete fabrication of polysilicon lines in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application where a SiON anti-reflective coating (ARC) is used to protect the polysilicon and silicon surfaces from damage during removal of the SiON layer. For example, drawing FIGS. 1–6 illustrate the process of the invention in making polysilicon gate electrodes and interconnection lines. It will be appreciated by those skilled in the art that the process of the invention can be used to make any structure where lithography and etching are used to form the structure and where a SiON ARC layer is used.

Figure 1:
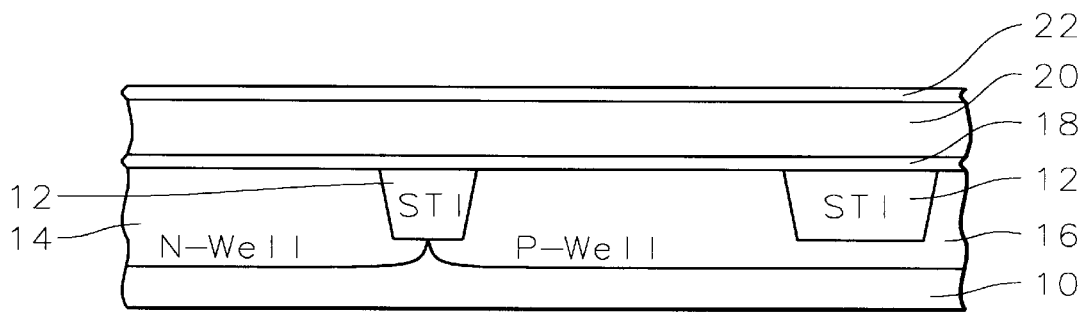
FIGS. 1 through 6 are cross-sectional representations of a preferred embodiment of the present invention.

Referring now more particularly to FIG. 1, there is shown a semiconductor substrate 10. Isolation regions are formed as is conventional in the art to separate active regions from one another. For example, isolation regions may be formed by local oxidation of silicon (LOCOS) or shallow trench isolation (STI) processes. In the example illustrated, STI regions 12 have been formed within the semiconductor substrate. Also, N-well 14 and P-well 16 may be formed within the substrate, as is conventional in the art and as illustrated in FIG. 1.

A gate silicon oxide layer 18 is grown on the surface of the substrate to a thickness of between about 20 and 40 Angstroms. A polysilicon or amorphous silicon layer 20 is deposited over the surface of the gate oxide layer to a thickness of between about 1000 and 3000 Angstroms.

A silicon oxynitride (SiON) ARC layer is typically used for photolithography in CMOS processes for feature sizes of 0.18 microns and beyond. The SiON layer 22 is deposited over the polysilicon layer 20 to a thickness of between about 100 and 400 Angstroms. This ARC layer increases the photolithography process window for the polysilicon process.

Figure 2:
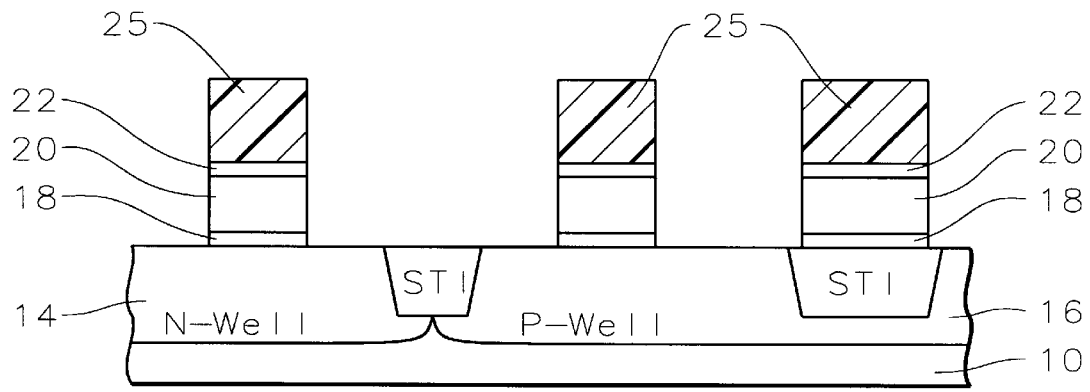
Figure 3:
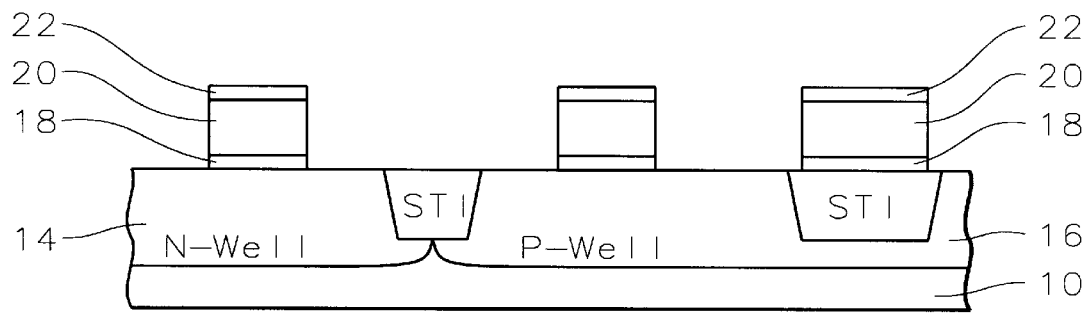

Next, a photoresist mask 25 is formed over the ARC layer, as shown in FIG. 2. The SiON layer 22, polysilicon layer 20, and gate oxide layer 18 are etched away where they are not covered by the photoresist mask 25. FIG. 3 illustrates the substrate after the photoresist mask has been removed. Polysilicon gate electrodes and interconnection lines have been formed.

After etching, the SiON ARC layer is to be removed. The inventors have found that damage to the polysilicon and silicon surfaces is caused by the stripping of the ARC layer, such as by $H_3PO_4$. Therefore, before the ARC layer is stripped, a protective oxide layer is formed over the silicon surfaces.

Figure 4:
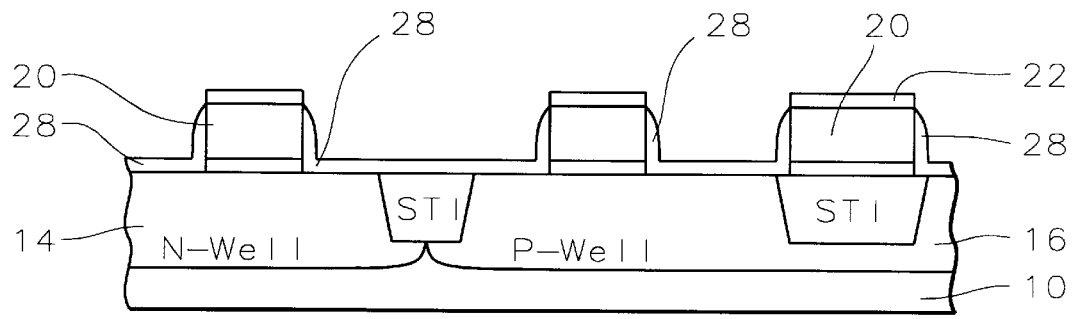

Referring now to FIG. 4, a wet oxidation is performed to grow an thin oxide layer 28 on the sidewalls of the polysilicon lines and on the surface of the silicon substrate. The oxide layer 28 has a thickness of between about 10 and 20 Angstroms.

Figure 5:
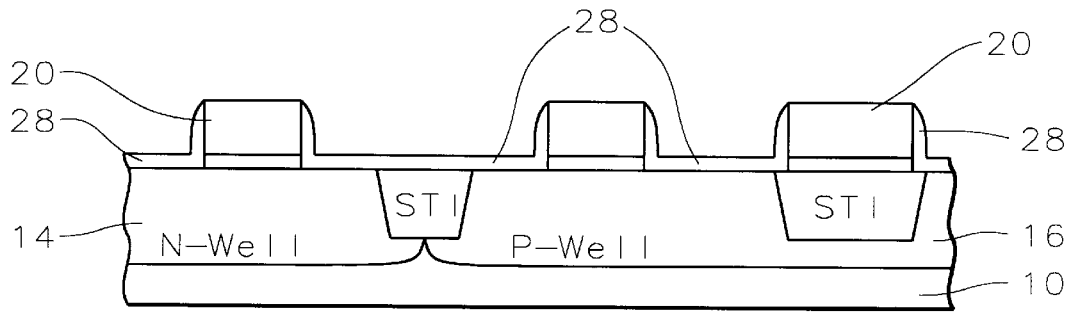

Now, as shown in FIG. 5, the SiON layer 22 is removed by a wet etch using hot $H_3PO_4$. Hot $H_3PO_4$ is currently the best choice for removing the SiON ARC layer because of its high selectivity etch recipe and no ion damage. The thin oxide layer 28 protects the polysilicon sidewalls and active area surfaces from damage during stripping of the SiON layer. Most of the thin oxide layer 28 is also removed during the SiON stripping. The remainder is removed afterward.

Figure 6:
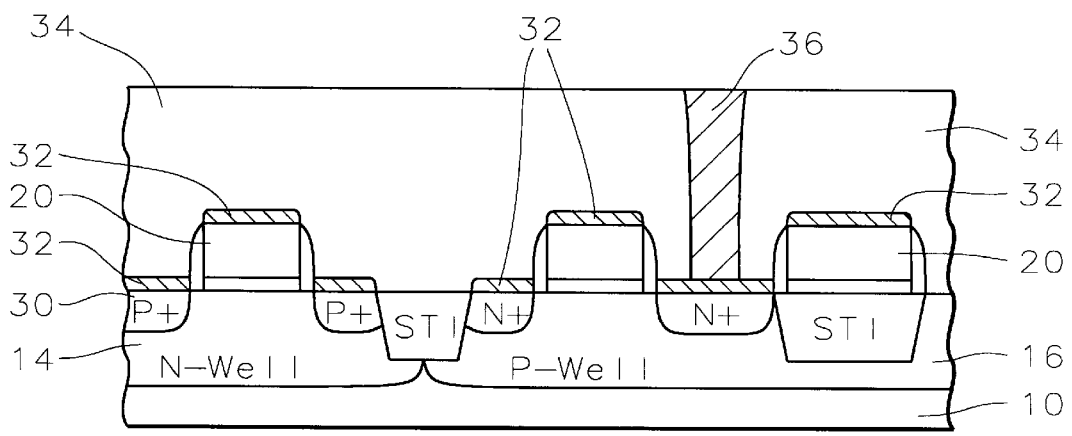

Processing continues as is conventional in the art, as shown in FIG. 6. For example, in the CMOS application illustrated in the drawing figures, source and drain regions 30 are formed in the semiconductor substrate adjacent to the gate electrodes. The gate electrodes and source and drain regions are silicided 32. An interlevel dielectric layer 34 is deposited and electrical contacts 36 are completed, as is conventional in the art.

The present invention provides a process for lithography and etching using a SiON ARC layer which increases the photolithography process window for polysilicon and which avoids damage to the polysilicon sidewalls and active area surfaces. The thin oxide protection layer formed by wet oxidation before removal of the SiON layer protects the silicon surfaces from damage during SiON stripping.

While the invention has been particularly shown and described with reference to the preferred embodiments thereof, it will be understood by those skilled in the art that various changes in form and details may be made without departing from the spirit and scope of the invention.

What is claimed is:

1. A method of fabricating polysilicon lines in the manufacture of an integrated circuit device comprising:

providing a gate oxide layer on the surface of a silicon substrate;

depositing a polysilicon layer overlying said gate oxide layer;

depositing a SiON anti-reflective coating layer overlying said polysilicon layer;

forming a photoresist mask over said SiON anti-reflective coating layer;

etching away said SiON anti-reflective coating layer, said polysilicon layer, and said gate oxide layer where they are not covered by said photoresist mask to form said polysilicon lines;

oxidizing said polysilicon lines and said silicon substrate to form a protective oxide layer on the sidewalls of said polysilicon lines and on the surface of said silicon substrate; and removing said SiON anti-reflective coating layer wherein said protective oxide layer protects said polysilicon lines and said silicon substrate from damage to complete fabrication of said polysilicon lines in the manufacture of said integrated circuit device.

2. The method according to claim 1 wherein said polysilicon layer has a thickness of between about 1000 and 3000 Angstroms.

3. The method according to claim 1 wherein said SiON layer has a thickness of between about 100 and 400 Angstroms.

4. The method according to claim 1 wherein said polysilicon lines have a width of less than about 0.18 microns.

5. The method according to claim 1 wherein said oxidizing step comprises a wet oxidation.

6. The method according to claim 1 wherein said protective oxide layer has a thickness of between about 10 and 20 Angstroms.

7. The method according to claim 1 wherein said step of removing said SiON layer comprises wet etching using hot $H_3PO_4$.

8. A method of fabricating gate electrodes and interconnection lines in the manufacture of an integrated circuit device comprising:

providing a gate oxide layer on the surface of a silicon substrate;

depositing a silicon layer overlying said gate oxide layer;

depositing a SiON anti-reflective coating layer overlying said silicon layer;

forming a photoresist mask over said SiON anti-reflective coating layer;

etching away said SiON anti-reflective coating layer, said silicon layer, and said gate oxide layer where they are not covered by said photoresist mask to form said gate electrodes and said interconnection lines;

oxidizing said gate electrodes and interconnection lines and said silicon substrate to form a protective oxide layer on the sidewalls of said gate electrodes and interconnection lines and on the surface of said silicon substrate; and removing said SiON anti-reflective coating layer wherein said protective oxide layer protects said gate electrodes and interconnection lines and said silicon substrate from damage to complete fabrication of said gate electrodes and interconnection lines in the manufacture of said integrated circuit device.

9. The method according to claim 8 wherein said silicon layer comprises polysilicon and has a thickness of between about 1000 and 3000 Angstroms.

10. The method according to claim 8 wherein said silicon layer comprises amorphous silicon and has a thickness of between about 1000 and 3000 Angstroms.

11. The method according to claim 8 wherein said SiON layer has a thickness of between about 100 and 400 Angstroms.

12. The method according to claim 8 wherein said gate electrodes and interconnection lines have a width of less than about 0.18 microns.

13. The method according to claim 8 wherein said oxidizing step comprises a wet oxidation.

14. The method according to claim 8 wherein said protective oxide layer has a thickness of between about 10 and 20 Angstroms.

15. The method according to claim 8 wherein said step of removing said SiON layer comprises wet etching using hot $H_3PO_4$.

16. A method of fabricating gate electrodes and interconnection lines in the manufacture of an integrated circuit device comprising:

providing a gate oxide layer on the surface of a silicon substrate;

depositing a silicon layer overlying said gate oxide layer;

depositing a SiON anti-reflective coating layer overlying said silicon layer;

forming a photoresist mask over said SiON anti-reflective coating layer;

etching away said SiON anti-reflective coating layer, said silicon layer, and said gate oxide layer where they are not covered by said photoresist mask to form said gate electrodes and said interconnection lines;

oxidizing said gate electrodes and interconnection lines and said silicon substrate to form a protective oxide layer on the sidewalls of said gate electrodes and interconnection lines and on the surface of said silicon substrate; and removing said SiON anti-reflective coating layer using hot $H_3PO_4$ wherein said protective oxide layer protects said gate electrodes and interconnection lines and said silicon substrate from damage to complete fabrication of said gate electrodes and interconnection lines in the manufacture of said integrated circuit device.

17. The method according to claim 16 wherein said silicon layer comprises polysilicon and has a thickness of between about 1000 and 3000 Angstroms.

18. The method according to claim 16 wherein said silicon layer comprises amorphous silicon and has a thickness of between about 1000 and 3000 Angstroms.

19. The method according to claim 16 wherein said SiON layer has a thickness of between about 100 and 400 Angstroms.

20. The method according to claim 16 wherein said gate electrodes and interconnection lines have a width of less than about 0.18 microns.

21. The method according to claim 16 wherein said oxidizing step comprises a wet oxidation.

22. The method according to claim 16 wherein said protective oxide layer has a thickness of between about 10 and 20 Angstroms.

* * * * *

UNITED STATES PATENT AND TRADEMARK OFFICE
CERTIFICATE OF CORRECTION

PATENT NO. : 6,074,905
DATED : June 13, 2000
INVENTOR(S) : Chu-Wei Hu, Chung-Te Lin, Chin-Shan Hou, Kuo-Hua Pan It is certified that error appears in the above-identified patent and that said Letters Patent is hereby corrected as shown below:

On the Title page, in item (54), please add the word ACTIVE to the Title so that it reads; -- FORMATION OF A THIN OXIDE PROTECTION LAYER AT POLY SIDEWALL AND ACTIVE AREA SURFACE --.

Signed and Sealed this

First Day of May, 2001

Attest:

NICHOLAS P. GODICI

Attesting Officer

Acting Director of the United States Patent and Trademark Office